United States Patent [19]

Vosteen

[11] Patent Number: 4,518,924
[45] Date of Patent: May 21, 1985

[54] HIGH VOLTAGE AMPLIFIER

[76] Inventor: Robert E. Vosteen, 1027 Archbald Rd., Waterport, N.Y. 14571

[21] Appl. No.: 451,815

[22] Filed: Dec. 21, 1982

[51] Int. Cl.³ .............................................. H03F 17/00
[52] U.S. Cl. ...................................... 330/51; 330/59; 330/84
[58] Field of Search ...................... 330/10, 51, 84, 59, 330/207 A, 251, 306

[56] References Cited

U.S. PATENT DOCUMENTS

| | | | |
|---|---|---|---|
| 3,525,936 | 8/1970 | Vosteen | 324/72 |
| 3,590,251 | 6/1971 | Vosteen | 330/59 X |
| 4,042,890 | 8/1977 | Eckerle | 330/10 X |
| 4,050,028 | 9/1977 | Vosteen | 330/10 |

*Primary Examiner*—James B. Mullins
*Attorney, Agent, or Firm*—Finnegan, Henderson, Farabow, Garrett & Dunner

[57] ABSTRACT

A system input is connected to a positive high voltage signal generator and a negative high voltage signal generator, the outputs of which are each connected to an output terminal via a photoconductor. The photoconductors are driven individually by an energizing circuit which has an input the sum of the system input and an attenuated signal fedback from the output terminal. For system inputs above a first predetermined level or below a second predetermined level, the appropriate photoconductor is rendered heavily conductive so that the output consists of the signal developed by the corresponding signal generator, which is proportional to the system input, less the small voltage drop which occurs across the photoconductor. For system inputs between the two predetermined levels, both high voltage signal generators deliver constant output signals and the energizing circuit reduces the conductivity of the appropriate photoconductor to produce the desired system output.

20 Claims, 3 Drawing Figures

HIGH VOLTAGE AMPLIFIER

BACKGROUND OF THE INVENTION

1. Field of the Invention

The invention relates to a high voltage amplifier and, in particular, to a bipolar high voltage, high efficiency DC amplifier.

2. Description of the Prior Art

Prior art devices for amplifying variable DC voltages to develop a high voltage output typically include a DC-to-DC inverter for producing a modulated signal on the primary winding of a step-up transformer, the secondary winding thereof being followed by a rectifier and filter. Such a device is capable of developing high voltage DC, but is limited in that the output is constrained to only one polarity (positive or negative) and the rate of change of the output is severely limited by the capacitance of the output filter in view of the load current.

Circuits have been developed that are capable of bipolar operation and demonstrate an improved rate of change of output by means of additional drive in both rise and fall directions. Note, for example, applicant's U.S. Pat. No. 3,525,936. Such circuits, however, require that a DC voltage be developed which exceeds twice the maximum output voltage of the circuit.

Through the use of photoconductor devices, inverter voltage amplifier circuits have been devised in which greater efficiency is achieved such that the maximum output of the circuit approaches the maximum DC voltage in the circuit. Such a system is the subject of applicant's U.S. Pat. No. 4,050,028. The power delivering capability of such systems, however, is constrained by the operating parameters of the photoconductors. Due to the limited availability of high power, high voltage photoconductors, the use of such systems as bipolar high voltage amplifiers has been limited.

SUMMARY OF THE INVENTION

An object of the present invention, therefore, is to construct a device capable of high voltage, high efficiency bipolar DC amplification utilizing photoconductors so that their operating parameters do not severely limit the output voltage range of the device.

Another object of the present invention is to construct a high voltage DC amplifier in which the maximum DC voltage in the system for any given DC voltage output is only minimally greater than the output voltage the circuit must deliver. For instance, a system designed according to the present invention for delivering a maximum of 20 KV requires a maximum internal DC voltage less than 2 KV greater than the output voltage which must be delivered.

Further objectives of the present invention will become apparent in the full description of the invention and drawings as set forth below.

Broadly, the principle of operation underlying the present invention is to develop a high voltage output signal from a low voltage input signal by means of amplifiers producing high voltage signals of opposite polarities, with the amplifiers being connected to an output terminal via devices having adjustable conductivity, such as photoconductors. The amplifiers produce high voltage signals as a function of the input signal such that for one range of input signals, their output is proportional thereto while for another range of input signals, their output remains constant. For input signals above a first predetermined level or below a second predetermined level, the levels corresponding to low-level input signals of positive or negative polarity, one of the photoconductors is turned on heavily so that the output signal consists primarily of the high voltage signal produced by the amplifier connected to the conducting photoconductor; in such a case, the amplifier produces an output that is proportional to the input signal, albeit slightly greater in magnitude than the desired output; the high voltage signal is then "fine tuned" to the desired output by adjusting the conductivity of the heavily conducting photoconductor via feedback means. For input signals between the predetermined levels, the amplifiers each produce a high voltage signal of a constant amplitude which is adjusted to produce the desired output voltage by adjusting only the conductivity of the photoconductors.

In an amplifier system according to the present invention, therefore, the photoconductors are called on to present a voltage drop thereacross primarily when the desired output of the amplifier is relatively low, i.e. approaching 0 V from either polarity. Thus, it is not necessary to utilize photoconductors capable of high power dissipation since such conditions never occur in the steady state in the present invention. Furthermore, amplifiers of the type used to develop the high voltage signals in the present invention generally experience difficulties with respect to accurately developing output signals approaching O V. The present invention avoids this problem by constraining the amplifiers to developing a signal of constant amplitude for desired outputs near O V and then "fine tuning" this signal by means of the photoconductors.

To achieve the objects and in accordance with the purpose of the invention, as embodied and broadly described herein, the high voltage amplifier system of this invention comprises (a) means coupled to an input terminal for producing a high voltage signal of a first polarity in response to an input signal, the first polarity high voltage signal being directly proportional to the input signal when the input signal exceeds a first predetermined level and being constant when the input signal is below the first predetermined level, (b) means coupled to the input terminal for producing a high voltage signal of a second polarity in response to the input signal, the second polarity high voltage signal being directly proportional to the input signal when the input signal falls below a second predetermined level and being constant when the input signal is above the second predetermined level, (c) first conductive means connected between the first polarity high voltage signal producing means and an output terminal, (d) second conductive means connected between the second polarity high voltage signal producing means and the output terminal, and (e) means for selectively adjusting the conductivity of the first and second conductive means in response to the input signal such that the first conductive means is heavily conducting when the input signal exceeds the first predetermined level and the second conductive means is heavily conducting when the input signal falls below the second predetermined level.

In addition, an amplifier system according to the present invention may include feedback means connected to the output terminal for producing a feedback signal porportional to the high voltage output signal whereby the means for selectively adjusting the conductivity of the first and second conductive means operates in response to the input signal and the feedback signal. A further advantage is achieved in the present invention as a result of the feedback means whereby a change in the input signal results in the output signal being affirmatively driven to the new desired level, thereby minimizing the rise and fall time of the output signal.

The accompanying drawings, which are incorporated in and constitute a part of this specification, illustrate three embodiments of the present invention and, together with the description, serve to explain the principles of the invention.

DETAILED DESCRIPTION OF THE PREFERRED EMBODIMENTS

Figure 1:
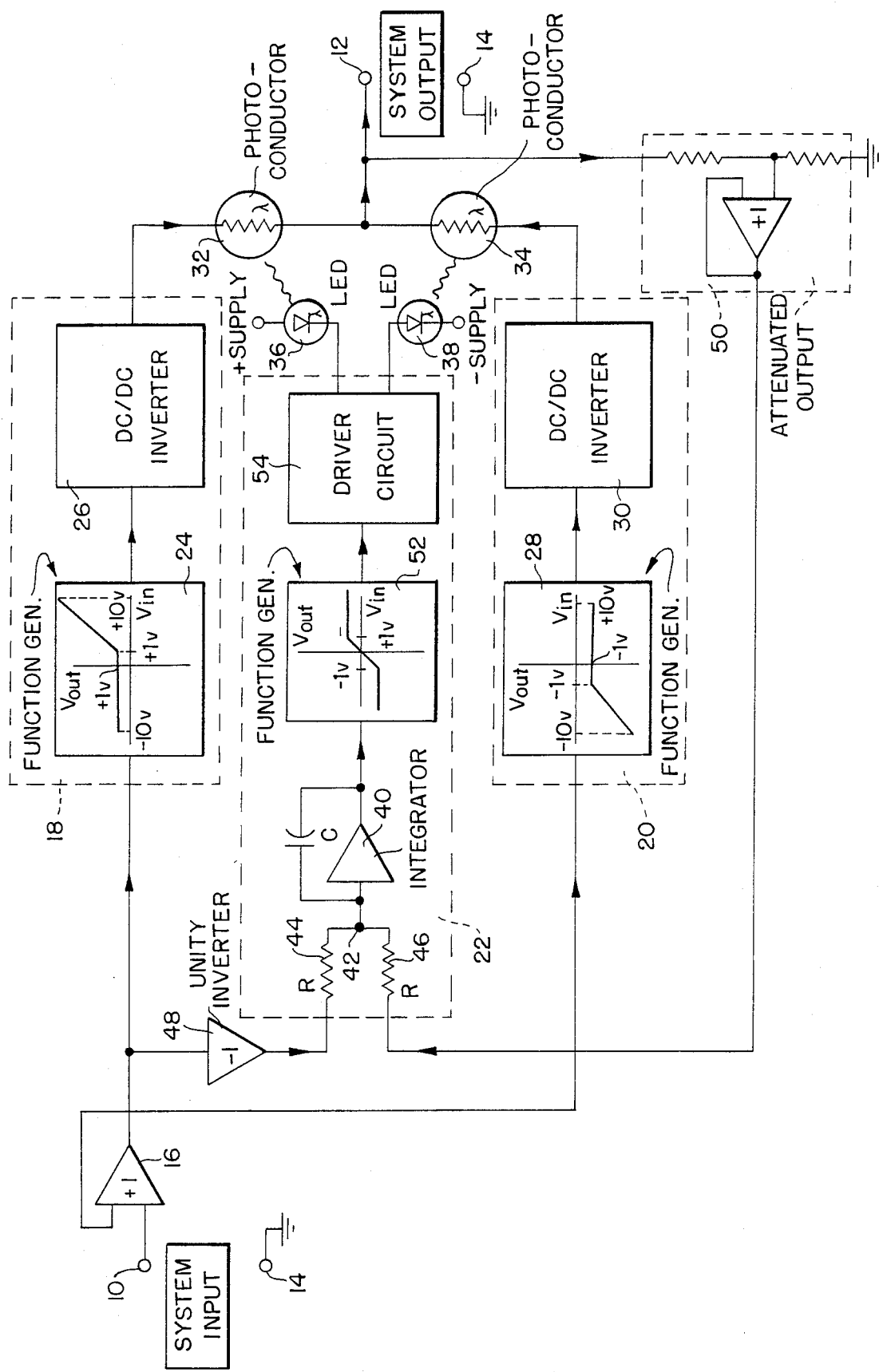
FIG. 1 is an electrical schematic diagram of a preferred embodiment of a high voltage amplifier system in accordance with the invention.

The present invention will now be described with reference to FIG. 1. The system is provided with an input terminal 10 to which a control signal is delivered in order to produce the desired high voltage output on output terminal 12. For convenience, both input and output terminals may be provided with a terminal 14 referenced to a ground potential common to the ground of the overall system.

In accordance with the invention, means are connected to the input terminal for producing a high voltage signal of a first polarity in response to the input signal, the first polarity high voltage signal being directly proportional to the input signal when the input signal exceeds a first predetermined level and being constant when the input signal falls below the first predetermined level. As embodied herein, the first polarity high voltage signal producing means comprises a positive voltage signal generator 18. The input signal provided at terminal 10 is delivered to the input of an operational amplifier 16 configured as a unity gain non-inverting amplifier. As shown in FIG. 1, the signal from operational amplifier 16 is delivered to a positive high voltage signal generator 18. Generator 18 includes a non-linear function generator 24 which receives the input signal from amplifier 16. The output of function generator 24 is connected to a DC—DC inverter 26. Function generator 24 develops an output voltage that increases in direct proportion to its input voltage once the latter has exceeded a predetermined level. In the circuit shown in FIG. 1, this level is +1 V. For all input signals below that predetermined level, function generator 24 outputs a constant voltage, e.g., +1 V in the circuit in FIG. 1.

Function generator 24 can comprise any of several well-known designs. The signal delivered by function generator 24 is amplified by DC—DC inverter 26 that is linear in operation. For example, presuming an amplification factor in inverter 26 of 2,000 connected to a generator 24 having a function as shown in FIG. 1, the output of positive voltage signal generator 18 is a constant +2 KV for all system inputs between −10 V and +1 V, and is 2000 times the input signal level for all input voltages between +1 V and +10 V. Inverter 26 may also comprise anyone of several well-known designs.

In accordance with the invention, means are also connected to the input terminal for producing a high voltage signal of a second polarity in response to the input signal, the second polarity high voltage signal being directly proportional to the input signal when the input signal falls below a second predetermined level and being constant when the input signal is above said second predetermined level. As embodied in FIG. 1, the second polarity high voltage signal producing means comprises a negative voltage signal generator 20 connected to the output of operational amplifier 16. Generator 20 includes a function generator 28 and a DC—DC inverter 30. The operation of these circuits is similar to that of generator 24 and inverter 26 described above and they can also be of known design. Generator 20, in contrast to generator 18, develops output voltage signals of negative polarity.

For the circuit shown in FIG. 1, including the function shown for generator 28 and an amplification factor of 2,000 for inverter 30, high voltage generator 20 would output a constant −2 KV for all system inputs between −1 V and +10 V, but this output would vary linearly down to −20 KV for system inputs from −1 V to −10 V.

The invention also comprises first conductive means connected between the first polarity high voltage signal producing means and the output terminal and second conductive means connected between the second polarity high voltage signal producing means and the output terminal. As embodied herein, the first conductive means includes a photoconductor 32 connecting the output of generator 18 to output terminal 12, while the second conductive means includes a photoconductor 34 connecting the output of generator 20 to output terminal 12. It is to be understood that photoconductors 32 and 34 may be replaced with any other type device of adjustable conductivity, such as a mechanically operated variable resistor, thermally responsive thyristors, or the like, in accordance with the present invention. As described in further detail hereinbelow, the signal output at terminal 12 is developed in accordance with the particular voltage signal output by either high voltage generator 18 or 20, reduced by the voltage drop developed across photoconductor 32 or 34, respectively.

In accordance with the invention, means are provided for selectively adjusting the conductivity of the first and second conductive means in response to the input signal such that the first conductive means is heavily conducting when the input signal exceeds the first predetermined level and the second conductive means is heavily conducting when the input signal falls below the second predetermined level. As embodied herein, the adjusting means includes an energizing circuit 22 light sources 36 and 38. Energizing circuit 22 contains an integrating amplifier 40, a summing junction 42, a function generator 52 and a driver circuit 54. In the embodiments illustrated in FIGS. 1-3, the foregoing elements function to energize light sources 36 and 38.

Photoconductors 32 and 34 are optically coupled to light sources 36 and 38, respectively. In a preferred embodiment, these light sources may consist of light emitting diodes (LEDs) with LED 36 being connected between a source of positive voltage and an energizing circuit 22, described in further detail herein below, and LED 38 being connected between a source of negative voltage and energizing circuit 22. A signal appearing on the cathode of LED 36 sufficiently less than the positive supply voltage causes the LED to be illuminated and photoconductor 32 to become conductive, whereas a voltage appearing on the anode of LED 38 sufficiently above the negative supply voltage causes photoconductor 34 to become conductive. The degree of conductivity depends proportionally upon the degree of illumination.

The system input presented across input terminals 10 and 14 is delivered to summing junction 42 via buffer amplifier 16 connected to a unity inverting amplifier 48 having an output coupled to a resistor 44. Thus, the signal delivered to junction 42 by resistor 44 is an inverted system input signal. Summing junction 42 is connected to the input of an operational amplifier 40 configured to function as an integrator, and which has an output connected to function generator 52. Function generator 52 is of a well-known design capable of delivering a constant signal of positive polarity for inputs exceeding a first predetermined level, such as +1 V as in FIG. 1, and a constant signal of negative polarity for inputs falling below a second predetermined level, such as −1 V as in FIG. 1. For inputs between these two predetermined levels, however, the output of generator 52 varies in direct proportion to the signal input thereto. This function is graphically shown inside function generator 52 in FIG. 1.

The output of function generator 52 is connected to driver circuit 54. Driver circuit 54 develops the signals that selectively energize LEDs 36 and 38. Keeping in mind the overall operation of the amplifier in which photoconductor 32 is heavily conducting for system inputs above a first predetermined level, +1 V as shown in FIG. 1, whereas photoconductor 34 is turned on heavily for system inputs below a second predetermined level, −1 V as shown in FIG. 1, driver circuit 54 is configured to produce a negative signal to turn on heavily LED 36 in response to an input signal above +1 V, as shown in FIG. 1, and to produce a positive signal to turn on heavily LED 38 in response to a input signal below −1 V, as shown in FIG. 1. For input signals between ±1 V, driver circuit 54 causes either one of LEDs 36 and 38 to illuminate at some value below maximum or causes both LEDs to illuminate at the 0 V crossover, such that the conductivity of photoconductors 32 and 34 can be continuously adjusted to produce the desired output signal. In view of the functions of these signals by driving circuit 54, it is to be understood that driving circuit 54 may comprise a non-linear inverting amplifier of well-known design.

According to the present invention, feedback means connected to the output terminal produce a feedback signal proportional to the high voltage output signal. As embodied herein, the feedback means are generally designated by the broken lines in FIG. 1 and include a resistor divider network coupled to output terminals 12 and 14, and an operational amplifier functioning as a buffer amplifer. In this manner, the feedback means 50 develop a feedback signal which is attenuated so as to be of the same magnitude as the system input signal presented at input terminals 10 and 14. The feedback signal is delivered to summing junction 42 via a resistor 46. As described in further detail hereinbelow, feedback means 50 serves to reduce the integrator input and thus the rate of change of integrator output until the system output reaches its desired level at which point the integrator output stabilizes.

The operation of the invention illustrated in FIG. 1 will now be described in detail. For illustrative purposes only, the following discussion presumes a system input varying between ±10 V with a system output varying between ±20 KV. Function generators 24, 28 and 52 have the characteristics illustrated in FIG. 1, and inverters 26 and 30 each have an amplification factor of 2,000. Accordingly, feedback means 50 has an attenuation factor of 2,000.

If an output of +10 KV is desired, +5 V is input across input terminals 10 and 14, causing positive voltage signal generator 18 to develop an output of slightly greater than +10 KV (+5 V times 2000) and negative voltage signal generator 20 to output −2 KV. The input signal also causes a proportional negative current to flow to summing junction 42, presuming the system was previously at rest. In response, the integrator 40, whose output increases positively at a rate dictated by its net input current, produces a positive signal approaching +1 V and function generator 52 responds by producing an equal voltage, causing driver circuit 54 to apply a negative signal to LED 36 in the manner described hereinabove. This negative signal is of sufficient amplitude to illuminate LED 36 to the degree necessary so as to render photoconductor 32 highly conductive. Thus, the desired +10 KV is produced by high voltage signal generator 18 less the IR drop of photoconductor 32, and is delivered to the system output across terminals 12 and 14. The +10 KV output signal is attenuated to +5 V and fed back to summing junction 42 via feedback means 50. Summing junction 42 is thereby driven to zero current by the combination of the −5 V signal delivered to resistor 44 and the +5 V signal delivered to resistor 46, and the output of integrator 40 stabilizes just below +1 V in view of its integrating function so that function generator 52 continues to output slightly less than +1 V to driver circuit 54 to render LED 36 illuminated such that photoconductor 32 continues to be conductive to the degree necessary to produce the +10 KV output signal across terminals 12 and 14. Accordingly, only a small voltage drop occurs across photoconductor 32, one which does not exceed its maximum power dissipation capability.

Conversely, an input of −5 V across terminals 10 and 14 would result in an output of −10 KV at terminals 12 and 14 as a consequence of photoconductor 34 being turned on heavily by LED 38. Again, photoconductor 34 experiences a low voltage drop across it which does not exceed its maximum power dissipation capabilities. As in the foregoing case, therefore, the voltage output by inverter 30 is adjusted so that after the small voltage drop due to photoconductor 34, the precise voltage desired is output at terminals 12 and 14.

Assuming now a system input of only +0.5 V across terminals 10 and 14, corresponding to a desired output of +1 KV, both generators 18 and 20 will be turned on to produce, respectively, +2 KV and −2 KV. The −0.5 V signal delivered to summing junction 42 by inverter 48 and resistor 44 causes integrator 40 to produce a positive-going output, which results in function generator 52 delivering a positive-going control signal to driver circuit 54. In response, driver circuit 54, which is an inverting amplifier, delivers a negative-going signal to LED 36. This gradually illuminates LED 36 and causes photoconductor 32 to become conductive so that a positive-going voltage signal is delivered across output terminals 12 and 14. This positive-going system output results in a positive-going feedback signal to summing junction 42 via attenuating feedback means 50, thereby reducing the current input to integrator 40 which, in turn, stabilizes the conductance of photoconductor 32. The integrator output stabilizes when the net current to the summing junction 42 is zero, indicating that the system output has reached the desired +1 KV.

From the foregoing, it may be appreciated that the photoconductors according to the present invention are modulated only through a limited output voltage region e.g., +2 KV, in the illustrative case. When the desired output voltage exceeds this limited range, the appropriate photoconductor is turned on "heavily", i.e., its conductivity is high, and its dissipation is low and well within its dissipation ratings. The photoconductors are rendered less conductive and dissipate to a greater degree only as the desired output voltage is between +2 KV and approaches 0 V. This inverse relation insures that the dissipation ratings of the photoconductors are never exceeded, i.e., the design of system does not require photoconductors characterized by high dissipation ratings. The use of an energizing circuit to drive photoconductors according to the present invention allows for output linearity of better than 0.1% to be achieved.

A further advantage of the present invention becomes apparent in the event the system is producing a voltage of one level and a shift to a new level is desired. Assuming no resistive load in the external load, but only a capacitive load of 1,000 pf with a 400 megohm divider load, a prior art amplifier would react slowly to any change because of voltage decay in the output filter and load capacitor. For example, if a voltage of +10 KV existed initially and a new voltage of +5 KV were suddenly commanded the output of a prior art device having a 2,000:1 attenuator resistance would decay exponentially with a time constant of 0.4 seconds—a very slow speed of response. On the other hand, the present invention as shown in FIG. 1 would react, as follows:

(1) The input voltage which was initially +5 V commanding a system output of +10 KV would suddenly drop to +2.5 V commanding an output of +5 KV.
(2) Inverter 26 would receive a new input calling for +5 KV out.
(3) The summing junction 42 of integrator 40 would be unbalanced due to the change via inverter 48 to −2.5 V while the signal delivered by attenuator circuit 50 would momentarily remain at +5 V. The net input into integrator 40 would cause its output to drop rapidly, thus turning off photoconductor 32 and turning on photoconductor 34. This causes the output terminals 12 and 14 to be connected to the −2 KV output of inverter 30 via photoconductor 34.
(4) In this case, the inverter 30 has the duty of discharging the external capacitance load, but is basically disconnected from the capacitive filter load of inverter 26 because photoconductor 32 is nonconducting and "off". Since the output load would normally be much less than the capacitive filter load, the system transient response is significantly improved under conditions of the decay of absolute output voltage.

Figure 2:
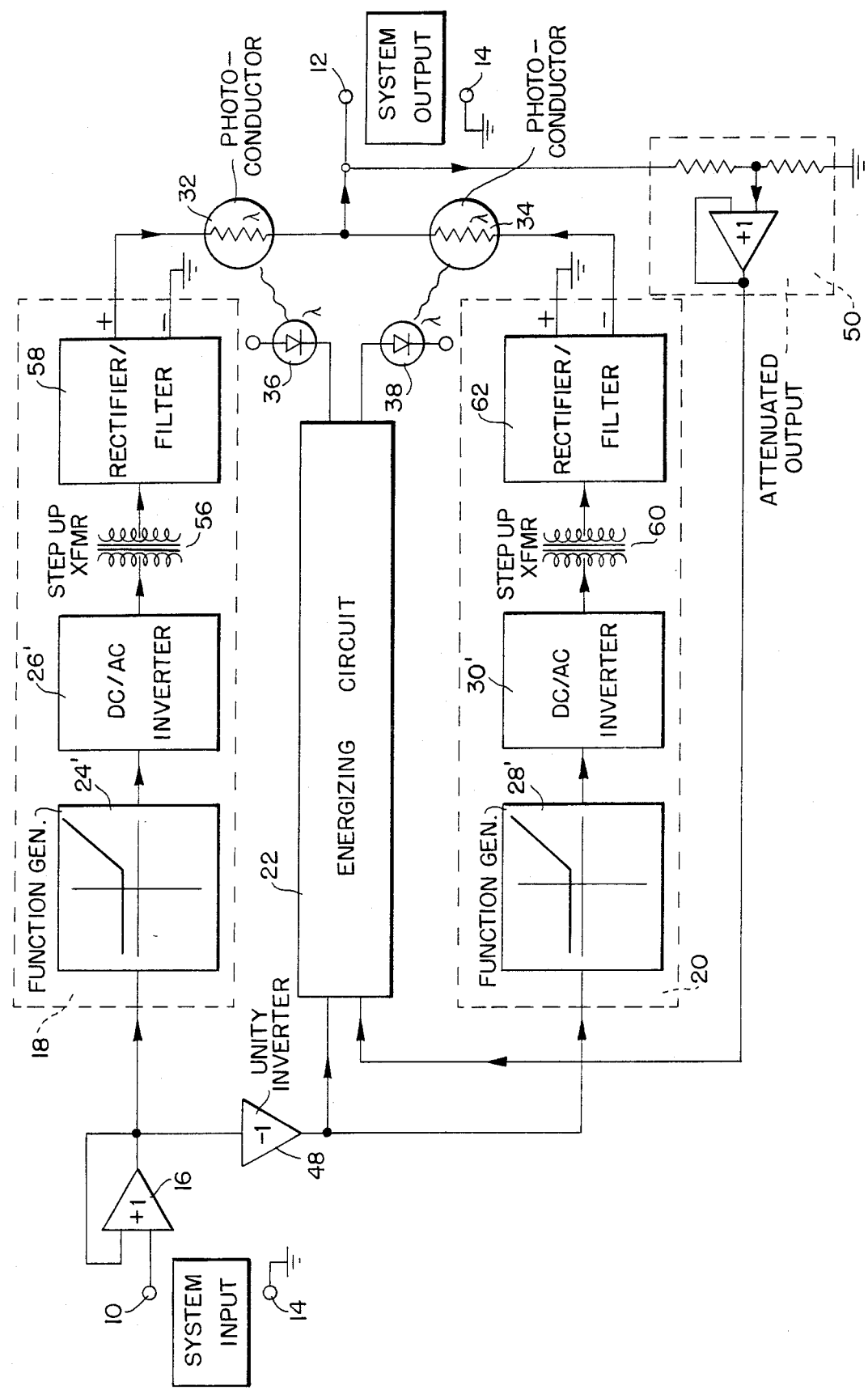
FIG. 2 is an electrical schematic diagram showing a variation of the amplifier system shown in FIG. 1.

It is within the scope of the present invention to modify the system to incorporate identical function generators and inverters for both voltage signal generators 18 and 20, each pair being followed by a transformer and rectifier/filter of opposite polarity, as shown in FIG. 2. There, elements identical to those shown in FIG. 1 are similarly numbered. According to this embodiment, positive voltage signal generator 18 includes a function generator 24' having characteristics similar to those discussed above with respect to function generator 24 of FIG. 1. Function generator 24' is coupled to a DC-AC inverter 26' which is in turn connected to a step-up transformer 56 and a rectifier/filter 58. The combination of these three latter elements serves to provide a high voltage DC amplified signal in response to the driving signal delivered by function generator 24'. Overall, positive voltage signal generator 18 of FIG. 2 operates in the same manner as set forth above with respect to FIG. 1.

In similar fashion, negative voltage signal generator 20 is provided with a function generator 28', a DC-AC inverter 30', a step-up transformer 60 and a rectifier/filter 62. An advantage is achieved by the circuit of FIG. 2 in that by connecting the input of function generator 28' to the inverted input signal developed by unity inverter amplifier 48 and by utilizing the negative output terminal of rectifier/filter 62, voltage signal generators 18 and 20 can be constructed of identical components. Thus, a savings may be achieved by using the same circuit devices for both generators 18 and 20.

Figure 3:
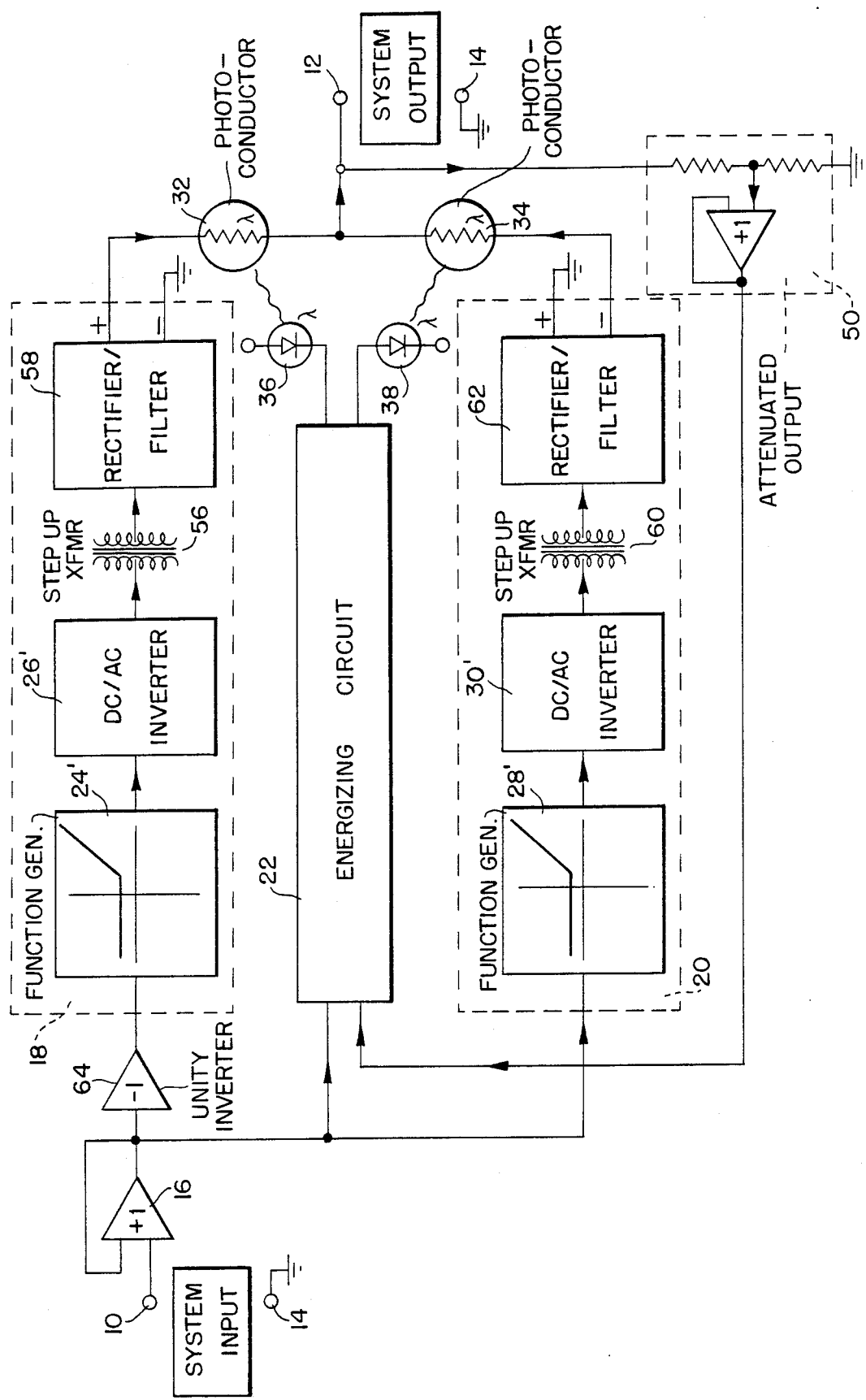
FIG. 3 is an electrical schematic diagram showing another variation of the amplifier system shown in FIG. 1.

In FIG. 3, an embodiment of the present invention is structured as an inverting amplifier by the introduction of an operational amplifier, configured as a unity gain inverter 64, connected to the input of function generator 24', and by eliminating operational amplifier unity inverter 48. In all other respects, the operation of the circuit, including voltage signal generators 18 and 20 and energizing circuit 22, is identical to the system set forth and described above with respect to FIG. 2.

Inasmuch as the present invention is subject to many variations, modifications and changes in detail, it is intended that all matter contained in the foregoing description or shown in the accompanying drawings shall be interpreted as illustrative and not in a limiting sense. Accordingly, it should be evident to those skilled in the art that minor variations may be made in the disclosed embodiments without departing from the spirit and scope of the invention.

What is claimed is:

1. A high voltage amplifier system capable of developing a high voltage output signal at an output terminal in response to a low voltage input signal presented to an input terminal, the system comprising:

means coupled to the input terminal for producing a high voltage signal of a first polarity in response to the input signal, said first polarity high voltage signal being directly proportional to the input signal when the input signal exceeds a first predetermined level and being constant when the input signal is below said first predetermined level;

means coupled to the input terminal for producing a high voltage signal of a second polarity in response to the input signal, said second polarity high voltage signal being directly proportional to the input signal when the input signal falls below a second predetermined level and being constant when the input signal is above said second predetermined level;

first conductive means connected between said first polarity high voltage signal producing means and the output terminal;

second conductive means connected between said second polarity high voltage signal producing means and the output terminal; and means for selectively adjusting the conductivity of said first and second conductive means in response to the input signal such that said first conductive means is heavily conducting when the input signal exceeds said first predetermined level and said second conductive means is heavily conducting when the input signal falls below said second predetermined level.

2. The high voltage amplifier system as recited in claim 1 wherein each of said first polarity high voltage signal producing means and said second polarity high voltage signal producing means includes:

means for producing a driving signal of a predetermined function in response to the input signal, and inverter means for amplifying said driving signal.

3. The high voltage amplifier system as recited in claim 2 wherein each of said first polarity high voltage signal producing means and said second polarity high voltage signal producing means further includes:

transformer means having a primary winding and a secondary winding, the primary winding being connected to an output of said inverter means, and rectifier means having an input connected to a secondary winding of said transformer means.

4. The high voltage amplifier system as recited in claim 3 including an inverting amplifier delivering the input signal to said driving signal producing means of said first polarity high voltage signal producing means.

5. The high voltage amplifier system as recited in claim 3 including an inverting amplifier delivering the input signal to said driving signal producing means of said second polarity high voltage signal producing means.

6. The high voltage amplifier system as recited in claim 1 further comprising feedback means connected between the output terminal and said adjusting means, for producing a feedback signal proportional to the high voltage output signal, whereby said adjusting means responds to the input signal and said feedback signal.

7. The high voltage amplifier system as recited in claim 6 wherein said feedback means includes a resistor voltage divider network connected to the output terminal.

8. The high voltage amplifier system as recited in claim 7 wherein said feedback means further includes a buffer amplifier having an input connected to said resistor voltage divider and delivering the feedback signal on an output thereof.

9. The high voltage amplifier system recited in claim 6 wherein said adjusting means includes:

a resistor summing node connected to receive the input signal and the feedback signal, an integrating amplifier having an input and output, with the input being connected to said summing node, means connected to the output of said integrating amplifier for producing a control signal according to a first predetermined function; and non-linear inverting circuit means connected for selectively adjusting said first and second conductive means in response to said control signal.

10. The high voltage amplifier system recited in claim 9 including an inverting amplifier delivering the input signal to said summing node.

11. The high voltage amplifier as recited in claim 1 further comprising an operational amplifier having an input connected to the input terminal and an output connected in common to said first polarity high voltage signal producing means, to said second polarity high voltage signal producing means and to said adjusting means.

12. The high voltage amplifier system as recited in claim 1 wherein said first and second conductive means each includes a photoconductor.

13. The high voltage amplifier system as recited in claim 12 wherein said adjusting means includes light sources optically coupled to said photoconductors of said first and second conductive means.

14. The high voltage amplifier system as recited in claim 1 wherein said adjusting means selectively controls said first and second conductive means such that one of said first and second conductive means is adjusted to have a conductivity in the range between being fully conductive and being nonconductive when the input signal is between said first and second predetermined levels.

15. A high voltage amplifier system capable of developing a high voltage output signal at an output terminal in response to a low voltage input signal presented to an input terminal, the system comprising:

means coupled to the input terminal for producing a high voltage signal of a first polarity in response to the input signal, said first polarity high voltage signal resulting from the input signal in accordance with a first predetermined function;

means coupled to the input terminal for producing a high voltage signal of a second polarity in response to the input signal, said second polarity high voltage signal resulting from the input signal in accordance with a second predetermined function;

first conductive means connected between said first polarity high voltage signal producing means and the output terminal;

second conductive means connected between said second polarity high voltage signal producing means and the output terminal;

feedback means connected to the output terminal for producing a feedback signal proportional to the high voltage output signal; and means for selectively adjusting the conductivity of said first and second conductive means in response to the input signal and the feedback signal in accordance with a third predetermined function.

16. The high voltage amplifier system as recited in claim 15 wherein said adjusting means includes:

a summing node for combining the input signal and the feedback signal, and an integrating amplifier having an input connected to said summing node.

17. The high voltage amplifier system as recited in claim 15 wherein said first and second conductive means each includes a photoconductor, and said adjusting means includes light sources optically coupled to said photoconductors.

18. The high voltage amplifier system as recited in claim 15 further comprising an inverting amplifier delivering the input signal to said first polarity high voltage signal producing means.

19. The high voltage amplifier system as recited in claim 15 further comprising an inverting amplifier in delivering the input signal to said adjusting means.

20. The high voltage amplifier system as recited in claim 15 further comprising a buffer amplifier for delivering the input signal to said first polarity high voltage signal producing means, to said second polarity high voltage signal producing means and to said adjusting means.

\* \* \* \* \*